United States Patent [19]

Watson et al.

[11] Patent Number: 4,486,804
[45] Date of Patent: Dec. 4, 1984

[54] OVERLOAD PROTECTOR FOR A TELEPHONE SET

[75] Inventors: John C. Watson; Bing G. Chan, both of London, Canada

[73] Assignee: Northern Telecom Limited, Montreal, Canada

[21] Appl. No.: 480,260

[22] Filed: Mar. 30, 1983

[51] Int. Cl.³ .............................................. H02H 5/04
[52] U.S. Cl. .................................. 361/104; 337/239; 337/407; 361/119
[58] Field of Search ................ 361/119, 104; 337/219, 337/239, 195, 178, 403, 407; 219/517

[56] References Cited

U.S. PATENT DOCUMENTS 4,047,143 9/1977 Burden et al. ...................... 337/239
4,379,318 4/1983 Ootsuka ............................. 361/104

Primary Examiner—Reinhard J. Eisenzopf
Attorney, Agent, or Firm—Sidney T. Jelly

[57] ABSTRACT

An overload protector for a telephone set or other telecommunications terminal comprises an electrical component having DC continuity and DC resistance mounted by leads on a circuit board, the leads soldered to the conductor pattern. A compression spring is positioned on each lead, held in compression between component and circuit board. An insulating member fits around the component. In application of an overload, the component heats up to a level at which sufficient heat travels down the leads to melt the solder. Usually both leads become unsoldered. A convenient component is a carbon block resistor, in the Tip or Ring line. The insulating member would be a sleeve loosely fitting over the resistor and retaining heat in the resistor.

10 Claims, 2 Drawing Figures

OVERLOAD PROTECTOR FOR A TELEPHONE SET

This invention relates to an overload protector for a telephone set, or other telecommunications terminal, and is particularly concerned with a slow acting fusing device for overcurrent protection.

Telephone sets, and similar terminals, can be subject to both voltage and current overloads, as a result of lightning induced surges and AC power cross faults. While protection is provided at various positions in the telephone system, including at the entry position of a customer, it has become desirable, and in many instances has become a requirement, that protection be provided in the terminal itself.

The terminal is required to remain operational following a number of surges of the order of 50 amperes. Under the condition of continually applied fault current it is necessary that the terminal be isolated.

There are various slow acting fuse devices, but various problems or disadvantages occur. In some cases they represent extra components in the circuitry and can cause problems in the circuit. The devices can represent a cost which adversely affects the total cost of the terminal. Some devices, while going "open circuit" under overcurrent conditions, will permit arcing under high voltage conditions, and this can be dangerous.

The present invention makes use of a component having DC continuity and DC resistance, normally present as part of the telephone set circuitry. One such component is a carbon block or slug composition type resistor in series in one of the lines. Normally the component is mounted on a printed circuit board (PCB) which is an existing part of the terminal. The component is mounted by means of leads on the side of the PCB remote from the conductor pattern to which the component is connected. A compression spring is positioned on each lead, held between the PCB and the component. An insulating sleeve is positioned around the component. The leads are soldered to the conductor pattern by the solder used to attach other components and devices, or a particular fusible alloy may be used. In operation, a continuous overload above a predetermined value causes the component to heat sufficiently for the heat to travel down the leads and eventually melt the solder, or fusible alloy. The springs force one of both leads out of the PCB, giving an open circuit. When one lead is freed first, the heat content of the device is generally sufficient to cause the other lead to be freed also. While the freeing of one lead is sufficient to create an open circuit, if two leads are freed, with complete removal of the component, the air gap is increased and any electric arc which is generated will be extinguished.

The invention will be readily understood by the following description in conjunction with the accompanying drawings, in which.

Figure 1:
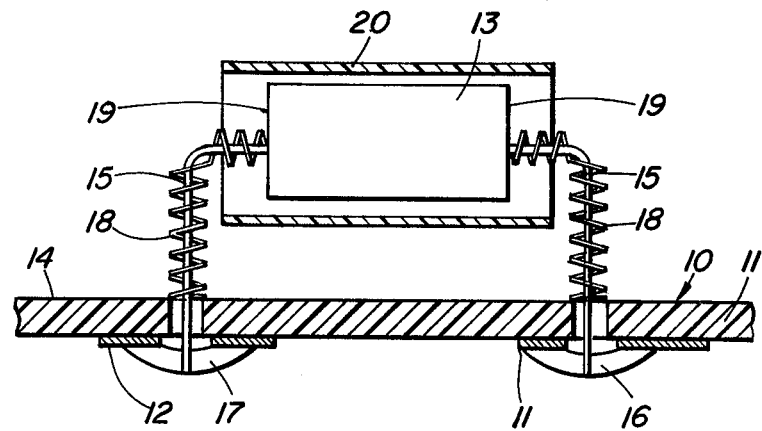
FIG. 1 is a diagrammatic cross-section through one arrangement in accordance with the invention.

As illustrated in FIG. 1, a printed circuit board 10 is composed of an insulating support member 11 and circuit patterns 11 and 12 on one surface. Mounted above the top surface 14 is a component 13, in the present example, a resistor. The leads 15 of the resistor pass through the PCB, being soldered to the patterns 11 and 12 at 16 and 17 respectively. A compression spring 18 is positioned on each lead 15. The springs are compressed between the end surfaces 19 of the resistor and the surface 14 of the PCB. Around the resistor 13 is a sleeve or tube 20 of insulating material, for example of woven glass fiber.

The resistor is in series with the terminal circuitry. The resistor is capable of withstanding lightning induced surges but heats up if a long term power load is applied, such as an AC power cross fault as occurs if a power line falls across a telephone line.

The sleeve 20 acts to contain the heat generated in the resistor, increasing the flow of heat to the leads. Continued application of the power fault results in sufficient heat reaching the solder at 16 and 17 and melt it. The springs 18 push the leads 15 out of the PCB. One lead may free first but generally the heat content is sufficient to free the other lead almost immediately. There will thus result an "open circuit" condition.

Various adjustments can be made to give desired "failure" or "fuse" conditions. The solder can be varied, low melting point fusible alloys being used. The distance the resistor is mounted from the PCB can be varied. The degree of thermal insulation provided by the sleeve can be varied. The thickness of the circuit patterns 11 and 12 and their area adjacent to the points of correction to the leads 15 can be varied to give a variable "heat sink" effect. More than one spring can be positioned on each lead.

A typical arrangement is as follows. The resistor is a carbon slug resistor, typically 1 watt 39 ohm, although this can vary. The resistor is approximately ¾ inches long and ¼ inches in diameter. The sleeve 20 is a fairly loose sliding fit on the resistor and is of woven glass fiber. Other materials can be used but must be capable of withstanding the temperature effects. The sleeve could be a molded part, of heat resistance plastic for example, and could be rigid or flexible. There is about ¼ inches clearance between resistor and the surface 14 of the PCB.

Figure 2:
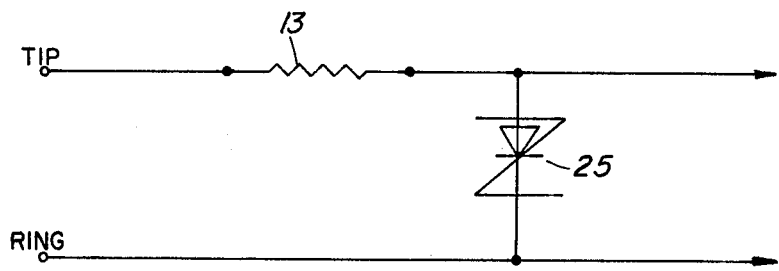
FIG. 2 is a diagrammatic illustration of the protection circuit.

FIG. 2 illustrates the application of the invention. In the circuit of FIG. 2 the resistor of FIG. 1 is indicated at 13. A zener diode 25 is connected across Tip and Ring while the resistor is in series in one of the lines, in the example Tip.

Conveniently, the resistor 13 and the diode or other device 25 are mounted on the PCB forming part of the deal assembly, but can also be on any other convenient PCB. A resistor is usually provided in the circuit as part of a protection circuit. The present invention can make use of this resistor, avoiding an added series resistance as can occur with a conventional "slo-blow" fuse. This avoids interfering with the "Off Hook Terminal Resistance" that is the operating resistance presented to the line. This is often a critical and closely specified parameter and therefor a substantial advantage occurs using a normally provided resistor for the invention. By so doing, protection is provided to other circuitry in the terminal.

While the invention has been described using a resistor, other components having suitable characteristics can be used. The requirement is that the component have DC continuity and DC resistance, and of course be exposed to any overload which arrives at the telephone set. The component aay have other characteristics, for instance, it may also have inductance. An example is a wire wound choke. An RF choke has DC resistance and inductance and also has DC continuity. It may be necessary to wind the choke with wire of a gage which is larger than normal so as to be able to withstand lightening surges up to a predetermined value. Thus the choke would act as a lightening surge dissipator, an RF choke, and as a slow fuse.

Other components can also be used. Preferably, a component already part of the circuit is used, but an additional component can be provided, specifically to act as a slow fuse.

What is claimed is:

1. An overload protector for a telephone set and similar telecommunications terminals, comprising;
   an electrical component having DC continuity and DC resistance, said component having two leads;
   said leads soldered to a conductor on a circuit board;
   a compression spring positioned on each lead and held under compression between the circuit board and the component;
   an insulating member around the component; and
   the arrangement such that on a continuous overload above a predetermined value, the component heats up to a level such that heat travels down the leads and melts the solder for at least one lead.

2. A protector as claimed in claim 1, said leads passing through holes in the circuit board and soldered to the conductor pattern, the solder pattern being on the side of the circuit board remote from the component.

3. A protector as claimed in claim 1, said insulating member being of woven glass fiber.

4. A protector as claimed in claim 1, said insulating member being a loose fit on the component.

5. A protector as claimed in claim 1, said leads soldered to the conductor pattern by a fusible alloy having a predetermined melting point.

6. A protector as claimed in claim 1, said component connected in series in one of the Tip and Ring lines of the telephone circuit.

7. A protector as claimed in claim 1, said component being a resistor having a main portion in the form of a carbon block, said leads extending laterally from each end of the main portion.

8. A protector as claimed in claim 7, said insulating member being a loose fitting sleeve over the main portion of the resistor.

9. A protector as claimed in claim 7, said resistor being a 1 watt 39 ohm resistor.

10. A protector as claimed in claim 9, said resistor about $\frac{3}{4}$ inches long and $\frac{1}{4}$ inches diameter, there being about $\frac{1}{4}$ inches clearance between the main portion of the resistor and the circuit board.

* * * * *